US006768390B1

(12) United States Patent
Dunsmore et al.

(10) Patent No.: US 6,768,390 B1
(45) Date of Patent: Jul. 27, 2004

(54) SYSTEM AND METHOD FOR GENERATING BALANCED MODULATED SIGNALS WITH ARBITRARY AMPLITUDE AND PHASE CONTROL USING MODULATION

(75) Inventors: Joel P. Dunsmore, Sebastopol, CA (US); Berry Carone, Windsor, CA (US); Stephen T. Sparks, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/405,572

(22) Filed: Apr. 2, 2003

(51) Int. Cl.[7] ................................. H03C 3/00
(52) U.S. Cl. ....................... 332/103; 375/298
(58) Field of Search ........................... 332/103; 375/298, 375/295; 455/119, 120, 125; 424/601, 76.78

(56) References Cited

U.S. PATENT DOCUMENTS

| | | | | |
|---|---|---|---|---|
| 5,371,481 | A | * 12/1994 | Tiittanen et al. | 332/103 |
| 5,574,755 | A | * 11/1996 | Persico | 375/295 |
| 6,208,698 | B1 | * 3/2001 | Marchesani et al. | 375/298 |
| 6,404,255 | B1 | * 6/2002 | Filliman et al. | 327/231 |

OTHER PUBLICATIONS

D. E. Bockelman, W. R. Eisenstadt, "Combined differential and Common–Mode Scattering Parameters: Theory and Simulation", IEEE Transactions on Microwave Theory and Techniques, vol. 43, No. 7, Jul. 1995, pp. 1530–1539.

D. E. Bockelman, W. R. Eisenstadt, "Pure–Mode Network Analyzer for On–Wafer Measurements of Mixed–Mode S–Parameters of Differential Circuits", IEEE Transactions on MTT, vol. 45, No. 7, Jul. 1997, pp. 1071–1077.

D. E. Bockelman, W. R. Eisenstadt, "Calibration and Verification of the Pure–Mode Vector Network Analyzer", IEEE Transactions on MTT, vol. 46, No. 7, Jul. 1998, pp. 1009–1012.

D. E. Bockelman, W. R. Eisenstadt, R. Stengel, "Accuracy Estimation of Mixed–Mode Scattering Parameter Measurements", IEEE Transactions on Microwave Theory and Techniques, vol. 47, No. 1, Jan. 1999, pp. 102–105.

* cited by examiner

*Primary Examiner*—Robert Pascal
*Assistant Examiner*—Joseph Chang

(57) ABSTRACT

Modulated differential (balanced) drive signals are created where, at least one of the signals can be controlled in phase relative to the other, and both of which could be controlled in amplitude and both of which have the same modulation envelope. In one embodiment, a coherent signal is generated in a first electronic signal generator (ESG) and applied to a second ESG. The coherent signal replaces the normal input signal of the second ESG and the I and Q inputs of the second ESG control the amplitude and phase of the output signal. This output signal is applied to a third ESG replacing the normal input signal to the vector modulator. The vector modulator is controlled by the same I and Q input as is the first ESG, thereby producing an output signal which has the same modulation envelope as the output signal from the first

24 Claims, 3 Drawing Sheets

SYSTEM AND METHOD FOR GENERATING BALANCED MODULATED SIGNALS WITH ARBITRARY AMPLITUDE AND PHASE CONTROL USING MODULATION

CROSS-REFERENCE TO RELATED APPLICATIONS

The present application is related to concurrently filed, co-pending, and commonly assigned U.S. patent application Ser. No. 10/405,533, entitled "SYSTEM AND METHOD FOR CALIBRATING BALANCED SIGNALS"; and U.S. patent application Ser. No. 10/405,556, entitled "SYSTEM AND METHOD FOR GENERATING BALANCED SIGNALS WITH ARBITRARY AMPLITUDE AND PHASE CONTROL USING MODULATION", the disclosures of which are hereby incorporated herein by reference.

TECHNICAL FIELD

This invention relates to balanced differential output generation circuits and more particularly to systems and methods for generating balanced modulated signals with arbitrary amplitude and phase control using modulation.

BACKGROUND OF THE INVENTION

Advances in technology have allowed for smaller, lower power devices. Many of these device topologies now use balanced (or differential) input drives instead of the traditional single-ended inputs and outputs. Thus, a two-port balanced device would have four single-ended connections, input+ and input−, and output+ and output−. It is known that for passive devices, or active devices operating in their linear region, it is sufficient to measure the individual single-ended responses from a balanced device, and combine the results mathematically to obtain the differential or balanced response. For this to work correctly, the device must behave linearly, which means the signals are small enough such that the device behavior does not change with signal level.

However, many devices are not linear throughout their range of operation. For example, an amplifier might change its bias current between large signals and small signals. For such devices, it is necessary to drive them with real-time signals that present the proper amplitude and phase relationships. These drive signals must be presented at the input ports (+ and −) of the device under test (DUT) with the same amplitude and 180° of phase difference, to be a true differential signal.

For some applications, a balun (balanced to unbalanced transformer) is often used, and is placed in close proximity to the device to avoid introducing any phase offset due to connections between the device and the balun. In test equipment applications, however, it may not be possible to control the interconnections sufficiently to maintain desired balance. Further, the signaling used in many devices is of a complex modulation form and has substantial bandwidth. Baluns may distort the modulated signals over this substantial bandwidth.

BRIEF SUMMARY

The present invention is directed to a system and method which solves the problem of modulated differential drives by creating a signal source that has two outputs, at least one of which can be controlled in phase relative to the other, and both of which could be controlled in amplitude and both of which have the same modulation envelope. In one embodiment, a coherent signal is generated in a first electronic signal generator (ESG) and applied to a second ESG. The coherent signal replaces the normal input signal of the second ESG and the I and Q inputs of the second ESG control the amplitude and phase of the output signal. This output signal is applied to a third ESG replacing the normal input signal to the vector modulator. The vector modulator is controlled by the same I and Q input as is the first ESG, thereby producing an output signal which has the same modulation envelope as the output signal from the first ESG.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION

Figure 1:
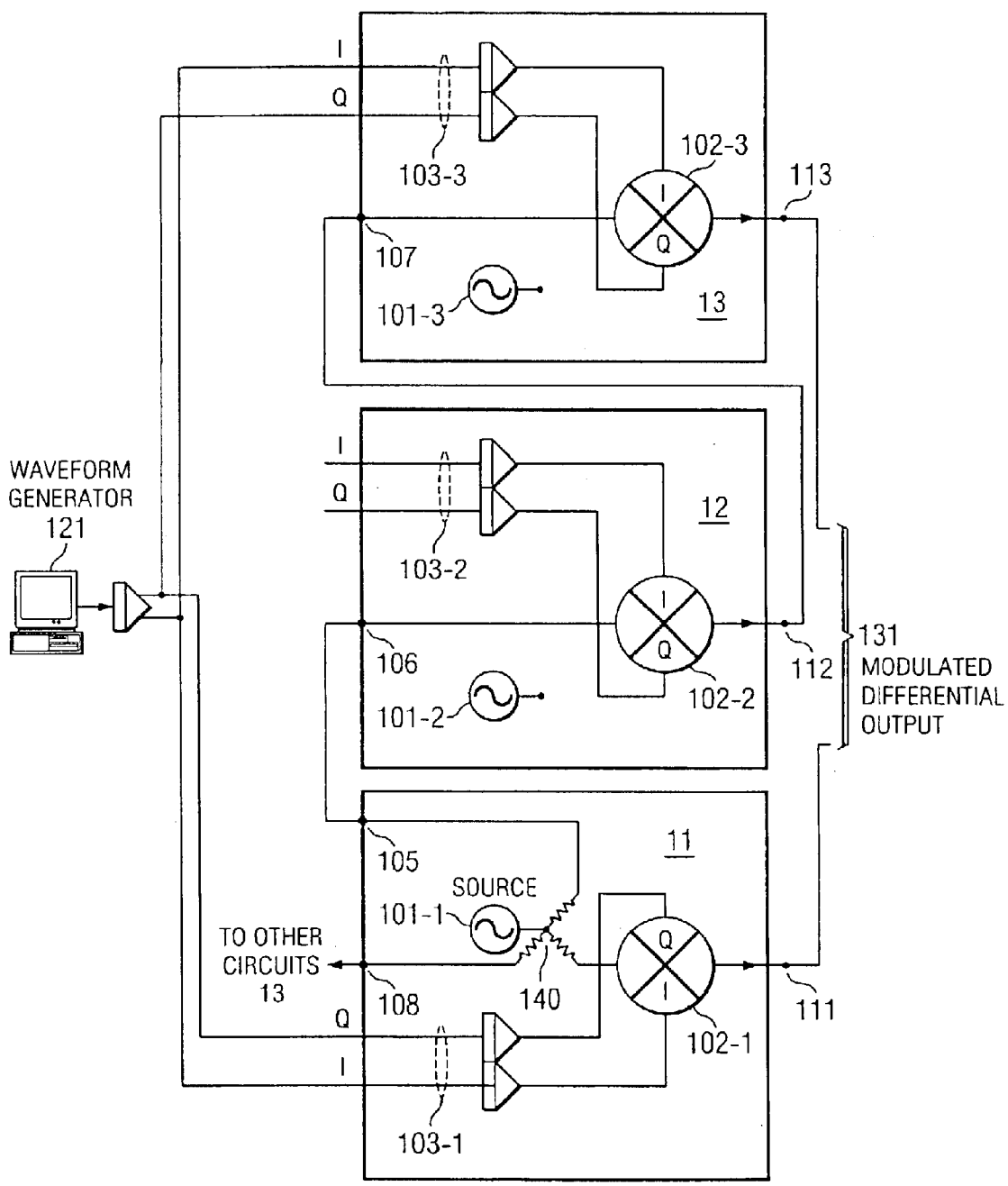
FIG. 1 is a block diagram showing one embodiment of a system and method for providing a differential output.

FIG. 1 shows system 10 having electronic signal generators (ESG) 11, 12, and 13, each of which provide complex signals using a vector modulator and an arbitrary waveform generator. ESG 11, 12, and 13 are available as Agilent Part Number E4438B, or equivalent. The signal source is created by synthesizer 101-1 which produces a continuous wave (CW) frequency signal. This signal is split, using splitter 140, a portion of the signal is routed to node 105 and portion of this same signal is also routed to vector modulator 102-1. The portion of the signal going to node 105 is referred to as the coherent carrier.

Vector modulator 102-1, under direction of I and Q inputs 103-1, controls the amplitude and phase of the output signal which is present on node 111 of ESG 11. This output signal is phase coherent with the signal on node 105.

In one implementation, the node 105 signal is routed to node 106 of ESG 12. ESG 12 is a modified version of ESG 11, where a means has been provided to bypass internal synthesizer 101-2 to allow an external signal to be applied to connect node 106 to vector modulator 102-2 of ESG 12. This allows the coherent carrier signal on node 106 from ESG 11 to be applied to vector modulator 102-2 of ESG 12. I and Q inputs 103-2, which advantageously are controllable DC inputs, selectively control vector modulator 102-2 thereby controlling the signal amplitude or phase of the coherent carrier as it is presented to node 112. Thus, node 112 has on it a signal which is both amplitude and phase adjusted and which is phase coherent relative to the signal on node 111.

When a balanced modulated signal is required, vector modulator 102-2 of second ESG 12 is set under control of I and Q (DC) inputs 103-2 to create a 180° phase shift in the coherent carrier signal provided on node 112 which then becomes the input to node 107 of third ESG 13 which is modified as was ESG 12. The signal on node 107 goes to vector modulator 102-3 and is amplitude and phase controlled by I and Q inputs 103-3 which are the same I and Q inputs for ESG 11. Output 113 from ESG 13 is paired with output 111 from ESG 11 to form modulated differential output 131.

Arbitrary waveform generator 121 provides the same signal to vector modulator 102-1 of ESG 11 and 102-3 of ESG 13 such that the modulation envelope is identical, and only the phase of the carrier is affected.

It should be recognized that, in general, any phase relationship between the carrier for the first ESG and the second ESG is achievable with such a configuration. If the output stages of the first and the third sources have independent amplitude control (not shown), any relationship with respect to magnitude and phase of the relative modulated outputs may be obtained. As such, differential, common and single-ended, as well as any other offset may be obtained from a source so constructed.

Note that the coherent carrier can be split as many times as is needed, such as shown at node 108, and can go to other circuits, such as circuit 13-N (not shown) to provide multiple phase shifted outputs, to multiple third modulators that can have I and Q modulation applied. Also not that this arrangement allows a dual (or multiple) output source where the amplitude and phase can be arbitrarily adjusted. For that, the carrier can be phase controlled with different modulation applied to circuits 11 and 13. This could be used, for example, to create an upper sideband signal from circuit 11 and a lower sideband signal from circuit 13, where the signals have a known phase relationship.

Figure 2:
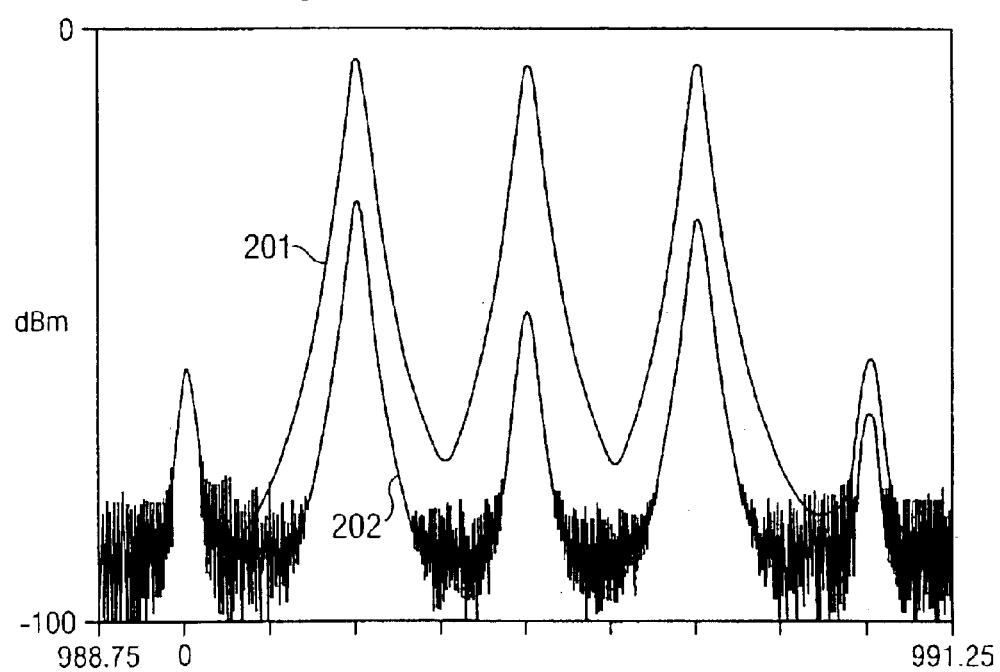
FIGS. 2 and 3 are graphs showing output characteristics of the circuit of FIG. 1.

FIG. 2 shows the comparison of three tone modulated signals with 0° phase between outputs (201) and 180° between outputs (202) combined into a spectrum analyzer. The degree of suppression (dBs down) is a measure of how well the two signals are in balance, i.e. 180° apart and with the same modulation. A perfect match would yield a zero output.

Figure 3:
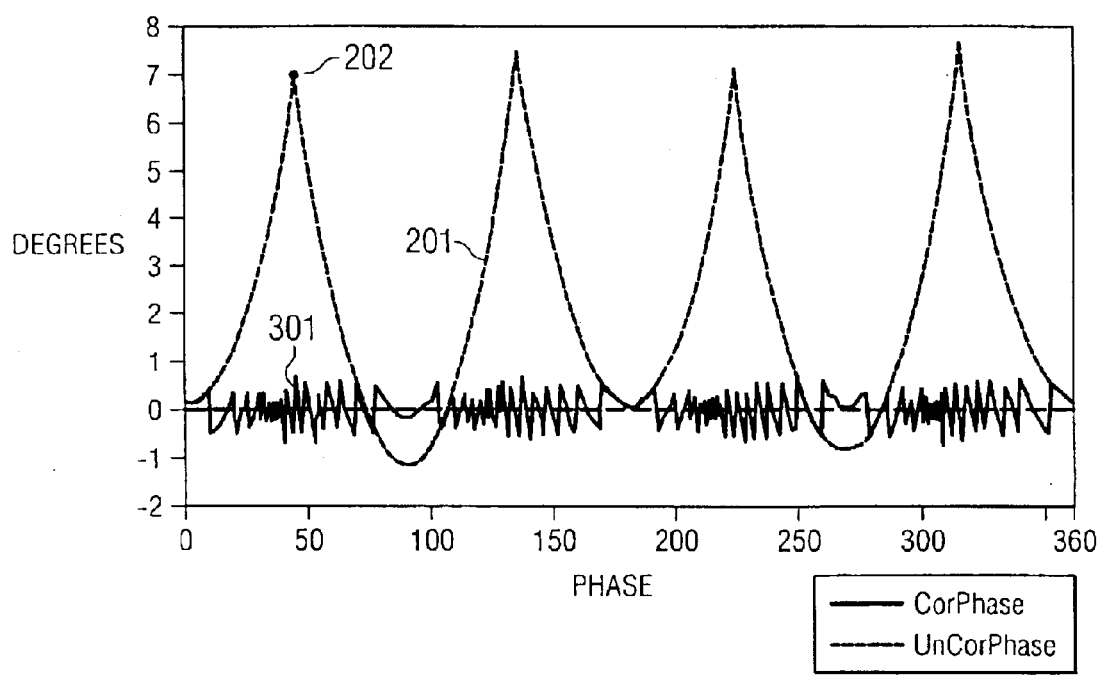

FIG. 3 shows the phase (graph 201) of output 111 compared to output 112, as a function of the desired phase setting. Thus, at a phase setting of 45° (point 202), the phase difference between signals 111 and 112 is slightly over 7°, while at a phase setting of 90° (point 203) the phase difference is 11 in the opposite direction At approximately 180° (point 204) the signals are in phase. This demonstrates that the phase outputs are not linear.

When these signals are used for a calibration process (for example, a calibration lookup table), the phase can be corrected so that any arbitrarily small phase error is obtainable. One method of achieving such calibration is shown in above-identified, co-pending U.S. patent application Ser. No. 10/405,533, entitled "SYSTEM AND METHOD FOR CALIBRATING BALANCED SIGNALS", filed concurrently herewith.

Waveform 301 of FIG. 3, shows the result of correcting the phase, where the phase correction resolution is 1°. The original phase relationship is shown as 201. As expected, the resulting phase output 30 is corrected to less than 1° (½ on either side of zero).

There are many applications where having two (or more) phase coherent sources, whose phase and amplitude are variable, can be useful in solving problems. One such application is load-pull, where it is desired to create an output reflection coefficient of a particular value, when a device (typically an amplifier) is driven at some level. This is particularly important when the device is driven at a level causing non-linear behavior. Having the capability of changing the magnitude and phase of the reflection, coherent with the drive signal, allows for the creation of any apparent load to the device under test regardless of the signal phase relationship.

Figure 4:
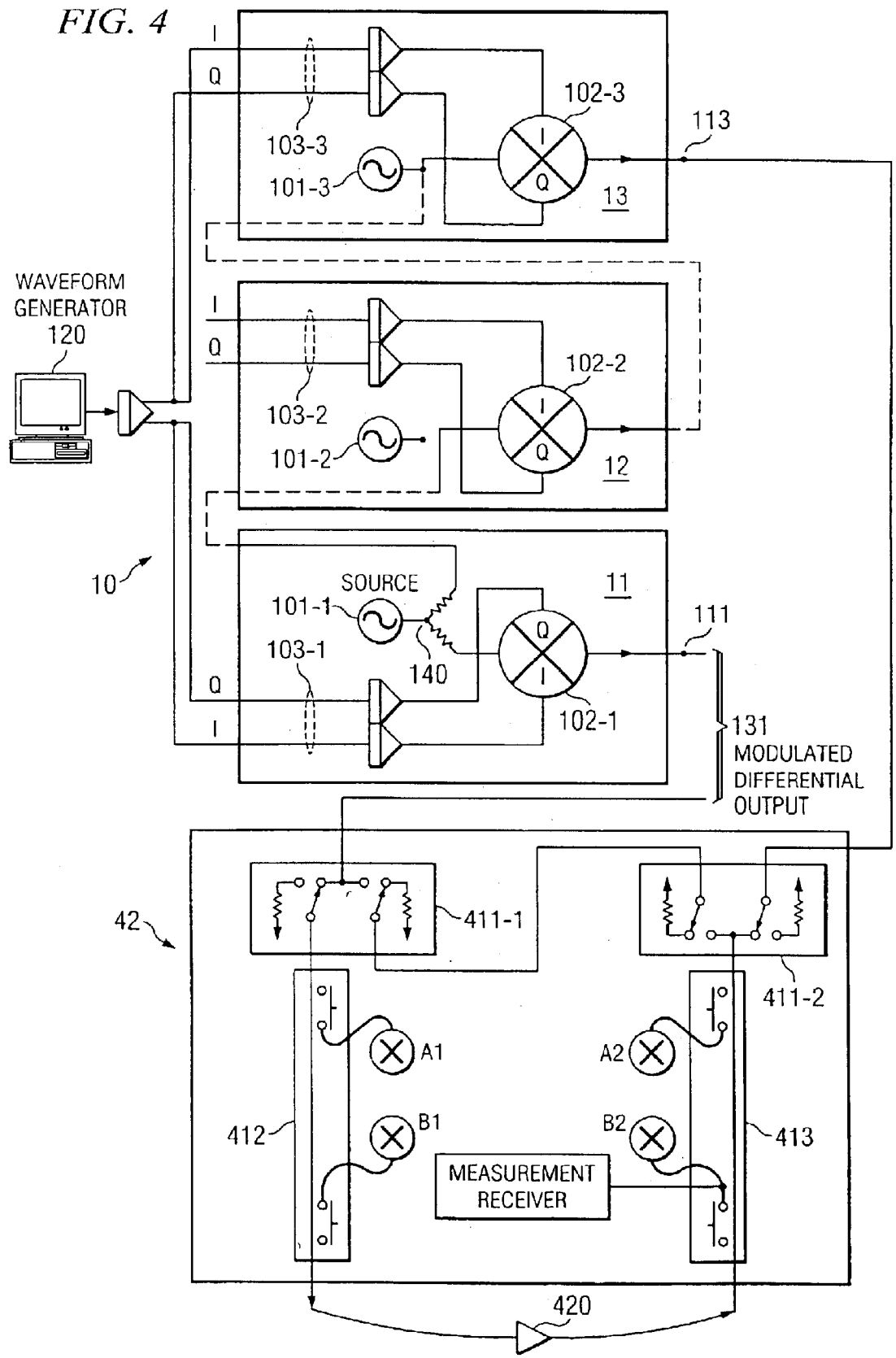
FIG. 4 is one embodiment of a testing system using the concepts of the disclosure.

As shown in FIG. 4, test set 42 receives a signal from node 111 of differential pair 131 of system 10 at switch 411-1 and applies that signal to a device under test, such as device 420. The signal at node 113, which has the same modulator envelope as does the signal on node 111 is applied, via switch 411-2, as a load-test signal to device 420 thereby providing a predetermined apparent load for the device under test. The differential signal at node 131 is created as discussed with respect to FIG. 2.

Note that while ESGs 11, 12, and 13 are shown as individual circuits, one or more could be combined and other circuits could be used in place of one or all ESGs, if desired. Also, the input signal from signal source 101-1 could be provided by an external source.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A dual output signal source comprising:
   a first circuit for controlling the amplitude and phase of a first output signal under control of control input signals, said first output signal being a modification of an input signal,
   a second circuit for providing a second output signal phase coherent with said first output signal;
   said second circuit operable for adjusting the phase of said input signal in relationship to said first output signal; and
   third circuitry for accepting said second output signal and for controlling the amplitude and phase of said second output signal under control of control input signals to provide a third output signal, such that said first and third output signals form said dual output source signals.

2. The dual output of claim 1 wherein said third circuitry control input signals are the same as said first circuit control signal.

3. The dual output of claim 1 further comprising:
at least a fourth circuitry for accepting said second input signal and for controlling the amplitude and phase of said input signal under control of input signals so as to provide at least a fourth output signal having an amplitude and phase in controlled relationship to said dual output signals.

4. The dual output signal source of claim 1 wherein said first, second, and third circuits are electronic signal generator (ESG) circuits, each ESG including at least one vector modulator having a signal input and I and Q control inputs, and wherein said second and third ESG signal inputs are derived at least in part from at least one of the other of said ESGs.

5. The dual output signal source of claim 4 wherein said I and Q input to said second ESG is a controllable DC input.

6. The dual output signal source of claim 4 wherein the normal internal input signal has been bypassed by said second and third ESG signal inputs.

7. The dual output source comprising the dual output signal source of claim 1 where the amplitude and phase of the outputs are adjusted such that the amplitudes of the outputs are the same, and the phase of the outputs are 180° apart.

8. Circuitry for providing a differential output, said circuitry comprising:
an input for receiving a continuous wave (CW) signal;
first input for receiving first complex modulated I and Q control signals;
a second input for receiving second I and Q control signals;
a third input for receiving a third complex modulated I and Q control signals;
a first vector modulator for receiving said CW signal and for providing a first output signal which is amplitude and phase modulated under control of said first complex modulated I and Q control inputs;
a second vector modulator for receiving a portion of said CW signal and for providing therefrom a second output signal which is phase modulated under control of said second I and Q control inputs; and
a third vector modulator for receiving said second output signal and for providing therefrom a third output signal which is amplitude and phase modulated under control of the said third complex modulated I and Q control, said first and third output signals forming said dual output.

9. The circuitry of claim 8 wherein said complex modulated I and Q inputs for said first and third modulators is the same signal.

10. The circuit of claim 8 wherein said second output signal is phase and amplitude adjusted such that said amplitude of said first output signal matches said third output signal and such that the phase is shifted by 180°.

11. The circuitry of claim 8 wherein each said vector modulators is part of a ESG.

12. The circuitry of claim 11 wherein the normal ESG input signal to said vector modulators in respective ESQs have been bypassed.

13. Circuitry for providing modulated balanced output signals; said circuitry comprising:
a signal source for providing a continuous wave (CW) RF signal and an output signal coherent with said CW RF signal;
a modulator for accepting said CW RF signal, and under control of I and Q inputs, controlling the amplitude and phase of a modulated first output signal;
a second modulator for accepting said coherent output signal and under control of I and Q inputs, controlling the amplitude and phase of a modulated second output signal; and
a third modulator for accepting said modulated second output signal and under control of said first modulator I and Q inputs, controlling the amplitude and phase of a modulated third output signal, said first and third output signals forming a modulated balanced differential pair.

14. The circuitry of claim 12 wherein said first modulator is within a first electronic signal generator (ESG) having a first signal source and a first vector modulator and wherein said second modulator is within a second ESG having a second signal source and a second vector modulator, and wherein a portion of said first signal source is provided to said second vector modulator instead of the signals from said second signal source, and where said third vector modulator is part of a third ESG having a third signal source, and wherein said second output signal is provided to said vector modulator instead of said signals form said third signal course.

15. The circuitry of claim 14 wherein the I and Q inputs to said second modulator are controllable DC signals.

16. A method of providing a modulated differential signal, said method comprising:
controlling the amplitude and phase of a first output signal, said first output signal being a modification of an input signal;
providing a second output signal phase coherent with said first output signal; and
adjusting the phase of said second output signals in relationship to said first output signals; and
providing said second output signal to a vector modulator so as to control the amplitude and phase of a third output signal exactly as the phase and amplitude of said first output signal is controlled.

17. The method of claim 16 wherein said second output signal is phase and amplitude adjusted such that said amplitude of said first output signal matches said second output signal and such that the phase is shifted by 180°.

18. The method of claim 17 wherein said amplitude and phase adjustment of said second output signal comprises controlling DC signals to I and Q inputs associated with said second output signals.

19. A method of providing modulated balanced output signals; said method comprising:
providing a continuous wave (CW) input signal and an output signal coherent with said CW input signal;
accepting said CW input signal, and under control of first I and Q inputs, controlling the amplitude and phase of a modulated first output signal;
accepting said coherent output signal and under control of second I and Q inputs, controlling the phase of a modulated second output signal; and
accepting said second output signal and under control of said first I and Q inputs, controlling the amplitude and phase of a modulated third output signal, said first and third modulated output signals forming a modulated balanced differential pair.

20. The method of claim 19 wherein said CW accepting step is performed within a first electronic signal generator (ESG) having a first signal source and a first vector modulator and wherein said coherent accepting step is performed within a second ESG having a second signal source and a second vector modulator, and wherein a portion of said first signal source is provided to said second vector modulator instead of the signals from said second signal source and wherein said second output accepting step is performed within a third ESG having a third vector modulator and a third signal source and wherein said second output is provided to said third vector modulator instead of the signals from said third signal source.

21. The method of claim 20 wherein said second modulator is controlled by controllable DC I and Q signals.

22. A circuit for providing a plurality of output signals, said circuit comprising:

a first modulation circuit having first I and Q inputs having a source of continuous wave (CW) frequency signals as a signal input;

a second modulation circuit having I and Q inputs and having a signal input;

means, including said first I and Q input of said first modulation circuit, for controlling the amplitude and phase of an output signal of said first modulation circuit, said output signal being a modification of a first portion of said CW signal;

means, including said I and Q inputs of said second modulation circuit, for controlling the amplitude and phase of an output signal from said second modulation circuit, said output signal being a modification of a second portion of said CW signal from said first modulation circuit applied to said signal input of said second modulation circuit;

a third modulation circuit having I and Q inputs and having a signal input; and means, including said first I and Q inputs applied to said third modulator and including said second output applied to said signal input of the third modulating circuit to provide a third output, said first and third outputs providing modulated balanced output signals.

23. The circuit of claim 22 wherein said first modulation circuit controlling means includes a splitter for providing a signal to said second modulator that is coherent with said output signal of said first modulation circuit.

24. Circuitry for device testing where it is desired to apply to said device a second signal having an amplitude and phase in modulated relationship to a first signal being applied to said device, said circuitry comprising:

a first circuit for controlling the amplitude and phase of a first output signal, said first output signal being a modification of an input signal, said input signal not being amplitude or phase controlled;

a second circuit for providing a second output signal phase coherent with said first output signal;

circuitry for adjusting the phase and amplitude of said second output signals in relationship to said first signals; and a third circuit for controlling the amplitude and phase of a third output signal having said second output signal as its input signal said third output signal being applied to said device as said second signal.

* * * * *